(12) United States Patent
Pain et al.

(10) Patent No.: US 6,326,230 B1
(45) Date of Patent: Dec. 4, 2001

(54) HIGH SPEED CMOS IMAGER WITH MOTION ARTIFACT SUPRESSION AND ANTI-BLOOMING

(75) Inventors: Bedabrata Pain, Los Angeles; Chris Wrigley, La Crescenta; Guang Yang, West Covina, all of CA (US); Orly Yadid-Pecht, Haifa (IL)

(73) Assignee: California Institute of Technology, Pasadena, CA (US)

( * ) Notice: Subject to any disclaimer, the term of this patent is extended or adjusted under 35 U.S.C. 154(b) by 0 days.

(21) Appl. No.: 09/479,379

(22) Filed: Jan. 5, 2000

Related U.S. Application Data

(60) Provisional application No. 60/115,190, filed on Jan. 6, 1999.

(51) Int. Cl.[7] .................................................. H01L 21/00
(52) U.S. Cl. .................................................. 438/57; 438/73
(58) Field of Search ................................. 438/57, 60, 73, 438/75, 199, 327, 202, 203, 204, 234, 328

(56) References Cited

U.S. PATENT DOCUMENTS

| 5,471,515 | * | 11/1995 | Fossum et al. | 377/60 |
| 5,835,141 | * | 11/1998 | Ackland et al. | 348/308 |
| 5,854,100 | * | 12/1998 | Chi | 438/202 |
| 5,909,026 | * | 6/1999 | Zhou et al. | 250/208.1 |
| 6,147,846 | * | 11/2000 | Borg | 361/91.1 |

FOREIGN PATENT DOCUMENTS

WO 97/28558   8/1997  (WO).

OTHER PUBLICATIONS

Yang et al., "A Snap–Shot CMOS Active Pixel Imager for Low–Noise, High–Speed Imaging", 1998 International Electron Devices Meeting, Dec. 6–9, 1998, Session 2, paper 7.

* cited by examiner

Primary Examiner—David Nelms
Assistant Examiner—David Nhu
(74) Attorney, Agent, or Firm—Fish & Richardson P.C.

(57) ABSTRACT

An image sensor includes pixels formed on a semiconductor substrate. Each pixel includes a photoactive region in the semiconductor substrate, a sense node, and a power supply node. A first electrode is disposed near a surface of the semiconductor substrate. A bias signal on the first electrode sets a potential in a region of the semiconductor substrate between the photoactive region and the sense node. A second electrode is disposed near the surface of the semiconductor substrate. A bias signal on the second electrode sets a potential in a region of the semiconductor substrate between the photoactive region and the power supply node. The image sensor includes a controller that causes bias signals to be provided to the electrodes so that photocharges generated in the photoactive region are accumulated in the photoactive region during a pixel integration period, the accumulated photocharges are transferred to the sense node during a charge transfer period, and photocharges generated in the photoactive region are transferred to the power supply node during a third period without passing through the sense node. The imager can operate at high shutter speeds with simultaneous integration of pixels in the array. High quality images can be produced free from motion artifacts. High quantum efficiency, good blooming control, low dark current, low noise and low image lag can be obtained.

11 Claims, 10 Drawing Sheets

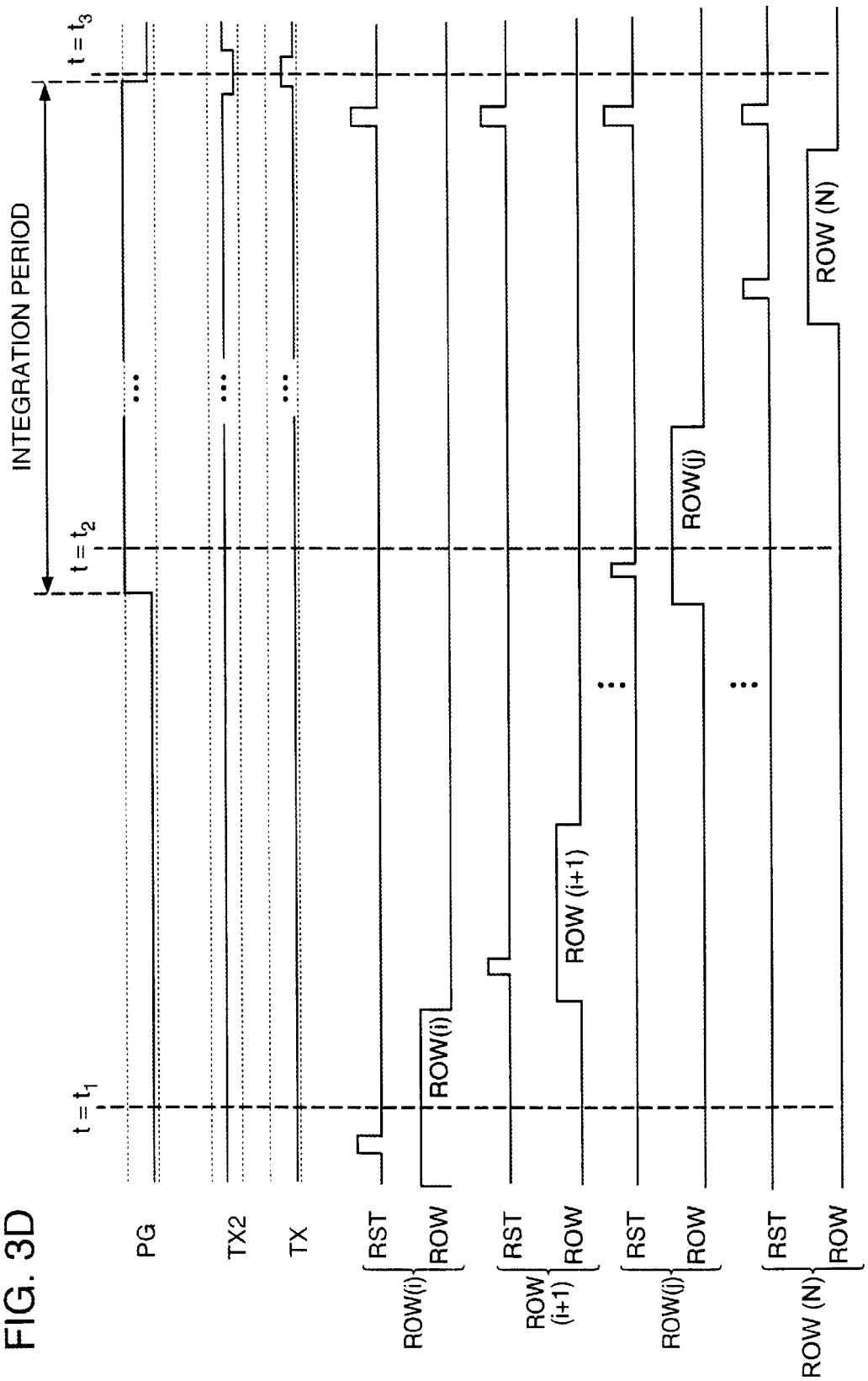

| ARRAY FORMAT | 128 x128 | PEAK QE | 18% |
|---|---|---|---|
| PIXEL TYPE | PHOTOGATE | LINEARITY | > 99.9 OVER 90% OF RANGE |
| FABRICATION PROCESS | 14.4-μm×14.4-μm | READ NOISE | < 10 ELECTRONS |
| PIXEL SIZE | HP 0.5-μm; 3-METAL, 1-POLY | FULL WELL | > 50,000 ELECTRONS |
| COMPLEXITY | 6 TRANSISTORS PER PIXEL | DYNAMIC RANGE | 74 dB |
| CONVERSION GAIN | 25 μV/e⁻ | MIN. EXPOSURE TIME | < 90 μsec |
| FIXED PATTERN NOISE | 0.1% AFTER DDS CORRECTION | DARK RATE | 10-77 pA/cm² @ R.T. |
| MAX. FRAME RATE | 400 frames/sec. | IMAGE LAG | < 74 dB |
| POWER | < 3 mW @ 1 Mpix./sec. | BLOOMING CONTROL | > 80 dB ABOVE SATURATION |

FIG. 4

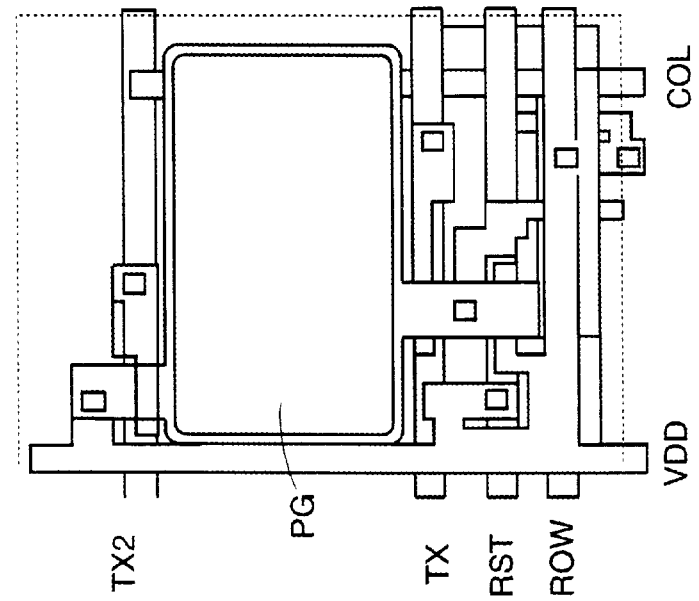
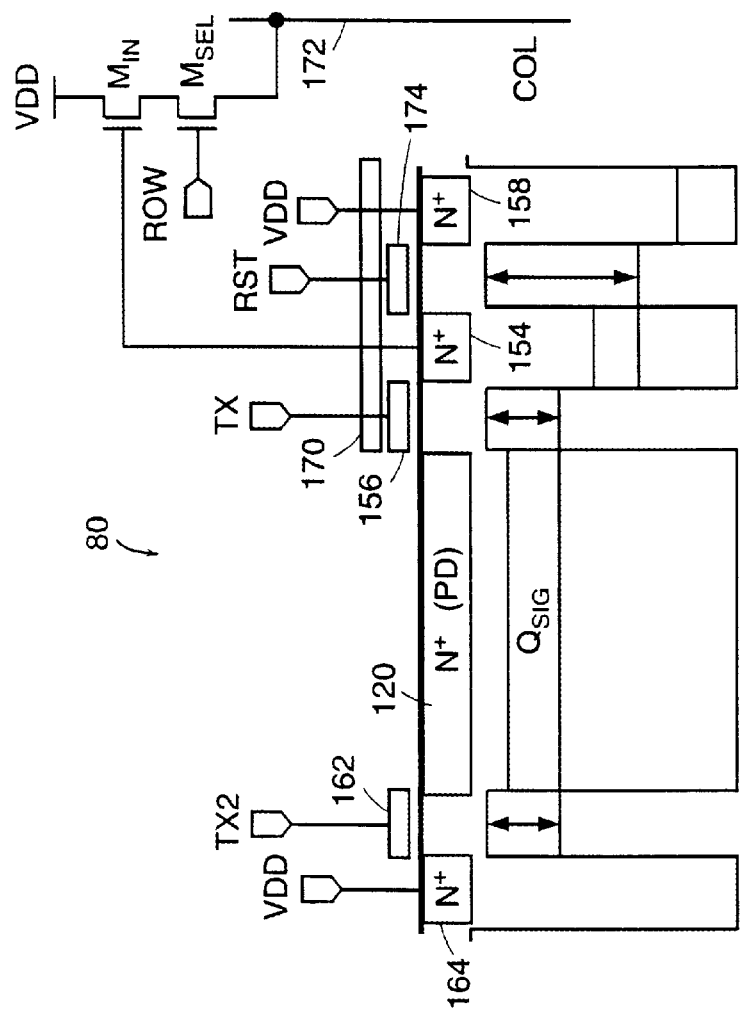
FIG. 5B
FIG. 5A

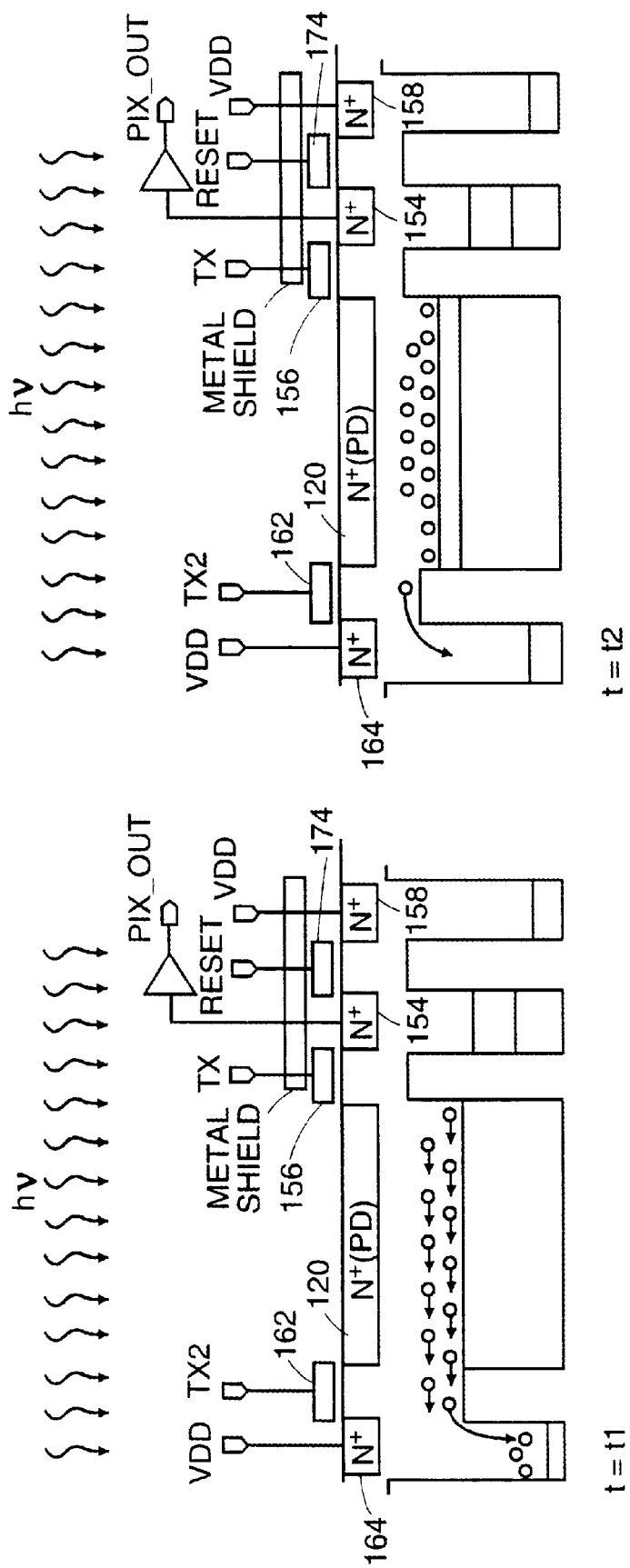

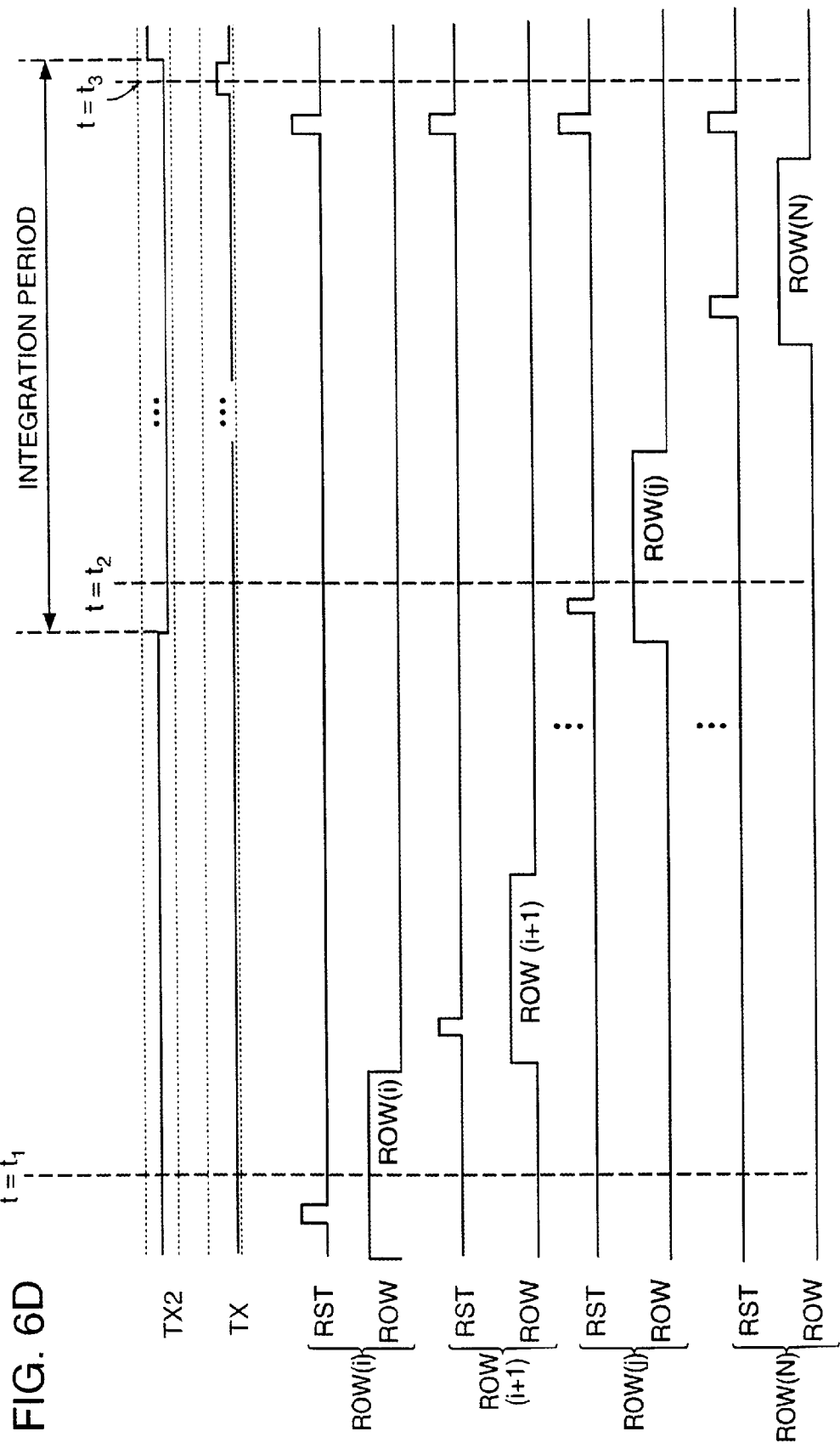

HIGH SPEED CMOS IMAGER WITH MOTION ARTIFACT SUPRESSION AND ANTI-BLOOMING

CROSS-REFERENCE TO RELATED APPLICATIONS

This application claims the benefit of U.S. Provisional Applicatication No. 60/115,190, filed Jan. 6, 1999.

STATEMENT AS TO FEDERALLY-SPONSORED RESEARCH

The invention described herein was made in the performance of work under a NASA contract, and is subject to the provisions of Public Law 96-517 (35 U.S.C. 202) in which the Contractor has elected to retain title.

FIELD OF THE INVENTION

This invention relates to image sensors.

BACKGROUND

Image sensors find applications in a wide variety of fields, including machine vision, robotics, guidance and navigation, automotive applications, and consumer products. Imaging circuits often include a two-dimensional array of photosensors each of which forms one picture element (pixel) of the image. Light energy emitted or reflected from an object impinges upon the array of photosensors and is converted by the photosensors to electrical signals. The individual photosensors can be scanned to read out and process the electrical signals.

One class of solid-state image sensors includes an array of active pixel sensors (APS). An APS is a light sensing device with sensing circuitry inside each pixel. Each active pixel includes a sensing element formed in a semiconductor substrate and capable of converting optical signals into electronic signals. As photons strike the surface of a photoactive region of the solid-state image sensors, free charge carriers are generated and collected. Once collected, the charge carriers, often referred to as a charge packet, are transferred to output circuitry for processing.

An active pixel also includes one or more active transistors within the pixel itself. The active transistors can amplify and buffer the signals generated by the light sensing element. Thus, in contrast to charge coupled devices (CCDs) and metal oxide semiconductor (MOS) diode arrays, an APS can convert the photocharge to an electronic signal prior to transferring the signal to a common conductor that conducts the signals to an output node.

APS devices can be fabricated in a manner compatible with complementary metal oxide semiconductor (CMOS) processes. Compatibility with CMOS processes allows many signal processing functions and operation controls to be integrated on an APS chip. Use of CMOS circuitry with APS devices also reduces the costs of manufacturing. CMOS circuitry also allows simple power supplies to be used and can result in reduced power consumption. Moreover, the active pixels of APS devices allow non-destructive readout and random access.

In an exemplary CMOS APS, charge carriers are collected in the photosite via a photogate. The charge packet is stored in spatially defined depletion regions of the semiconductor, also known as potential wells, in the semiconductor substrate beneath the photosite. The charge packet then is transferred to an isolated diffusion region via a transfer gate. The diffusion region receives the charge from the photogate well and sends a corresponding electrical signal to the pixel amplifier for further processing.

The near-surface potential within the semiconductor can be controlled by the potential of an electrode near the semiconductor surface. If closely-spaced electrodes are at different voltages, they will form potential wells of different depths. Free positive charges (e.g., holes) move from a region of higher potential to a region of lower potential. Similarly, free negative charges (e.g., electrons) move from the region of lower potential to the region of higher potential.

Typically, a CMOS active pixel array is operated in a rolling shutter mode in which each row of the array is exposed at different instants of time. The non-simultaneous exposure of the pixels can lead to image distortion, for example, when there is relative motion between the imager and the image that is to be captured. Furthermore, although the exposure time generally is defined by the duration for which the photogate is turned on, floating diffusion regions can continue to collect photocharges even after the photogate is turned off. Transfer of such unwanted charges into the sense node can result in image distortion and excess noise. Furthermore, the distortions tend to become more pronounced as the exposure time is reduced.

SUMMARY

An image sensor includes pixels formed on a semiconductor substrate. Each pixel includes a photoactive region in the semiconductor substrate, a sense node, and a power supply. A first electrode is disposed near a surface of the semiconductor substrate. A bias signal on the first electrode sets a potential in a region of the semiconductor substrate between the photoactive region and the sense node. A second electrode is disposed near the surface of the semiconductor substrate. A bias signal on the second electrode sets a potential in a region of the semiconductor substrate between the photoactive region and the power supply node. The image sensor includes a controller that causes bias signals to be provided to the electrodes so that photocharges generated in the photoactive region are accumulated in the photoactive region during a pixel integration period, the accumulated photocharges are transferred to the sense node during a charge transfer period, and additional photocharges generated in the photoactive region are transferred to the power supply node during a third period without passing through the sense node.

According to another aspect, an image sensor includes an array of pixels formed in a semiconductor substrate. Each pixel includes a photoactive region in the semiconductor substrate, a sense node, a power supply node, and first and second transfer gates disposed in proximity to the surface of the semiconductor substrate. The image sensor also includes a controller that causes bias signals to be provided to the electrodes to operate the pixels in one of at least three modes. In a first mode, photocharges generated in the photoactive region of a pixel are accumulated in the pixel's photoactive region. In a second mode, the accumulated photocharges are transferred to the pixel's sense node via the pixel's first transfer gate. In a third mode, photocharges generated in the pixel's photoactive region are transferred to the pixel's power supply node via the pixel's second transfer gate without passing through the pixel's sense node.

In another aspect, a method of operating a photosensitive pixel includes biasing first and second transfer gates disposed in a vicinity of a photoactive region of a semiconductor substrate to accumulate photocharges in the photoactive region during a pixel integration period. The first and second transfer gates are biased to transfer the accumulated photocharges to a sense node via a region of the semiconductor substrate disposed below the first transfer gate. Subsequently, the first and second transfer gates are biased to transfer additional photocharges in the photoactive region to a power supply node via a region of the semiconductor substrate disposed below the second transfer gate without passing through the sense node.

In some implementations, one or more of the following features may be present. During the pixel integration period, the second transfer gate can be biased with a voltage higher than a bias voltage on the first transfer gate. For example, the second gate can be biased to provide an anti-blooming function, in other words, to allow excess photocharges in the photoactive region to be transferred to the power supply node via the region of the semiconductor substrate below the second transfer gate during the integration period.

To transfer the accumulated photocharges to the sense node, a bias voltage on a photogate above the photoactive region may be lowered. To transfer photocharges in the photoactive region to the power supply node via the second transfer gate prior to commencing a subsequent pixel integration period, the second transfer gate can be biased with a voltage higher than that of the first transfer gate.

Preferably, the first and second transfer gates are biased to transfer the additional photocharges in the photoactive region to the power supply node prior to commencing a subsequent pixel integration period.

The integration period of the pixels can take place at substantially the same time to achieve snap-shot imaging. Similarly, photocharges stored by the pixels in an array can be transferred to respective sense nodes at substantially the same time. An imager with multiple pixels can include, for example, photogate-type pixels and/or photodiode-type pixels. Each pixel can include a reset gate to allow the pixel to be reset. Active pixels or passive pixels can be used.

Some implementations include one or more of the following advantages. High quality imaging can be obtained from an electronically shuttered CMOS imager. The imager can operate at high shutter speeds with simultaneous integration of pixels in the array. The sense node, separated from the photoactive region by the first transfer gate, can serve as a frame buffer to allow photocharges to be integrated in the photoactive region independently of the frame readout time. In other words, the exposure time can be independent of the readout time. Pulsing the second transfer gate after the photocharges have been transferred to the sense nodes can help ensure that subsequent charges are drained away, thereby providing both blooming control and isolation of the sense node. Imager chips that operate at high shutter speeds to produce high quality images free from motion artifacts can be fabricated. High quantum efficiency, good blooming control, low dark current, low noise and low image lag can be obtained.

Other features and advantages will be apparent from the following detailed description, the accompanying drawings and the claims.

BRIEF DESCRIPTION OF THE DRAWINGS

FIG. 3D is a timing diagram of various control signals associated with FIGS. 3A, 3B and 3C.

FIG. 4 is a table listing design specifications and test results of an exemplary snapshot APS according to the invention.

FIG. 5A illustrates a schematic cross-section and potential well diagram of a photodiode-type active pixel sensor according to the invention.

FIG. 5B illustrates an exemplary layout of the pixel in FIG. 5A.

FIGS. 6A, 6B and 6C illustrate schematic cross-sections and potential well diagrams during operation of the photodiode-type pixel according to the invention.

FIG. 6D is a timing diagram of various control signals associated with FIGS. 6A, 6B and 6C.

DESCRIPTION OF THE PREFERRED EMBODIMENTS

Figure 1:
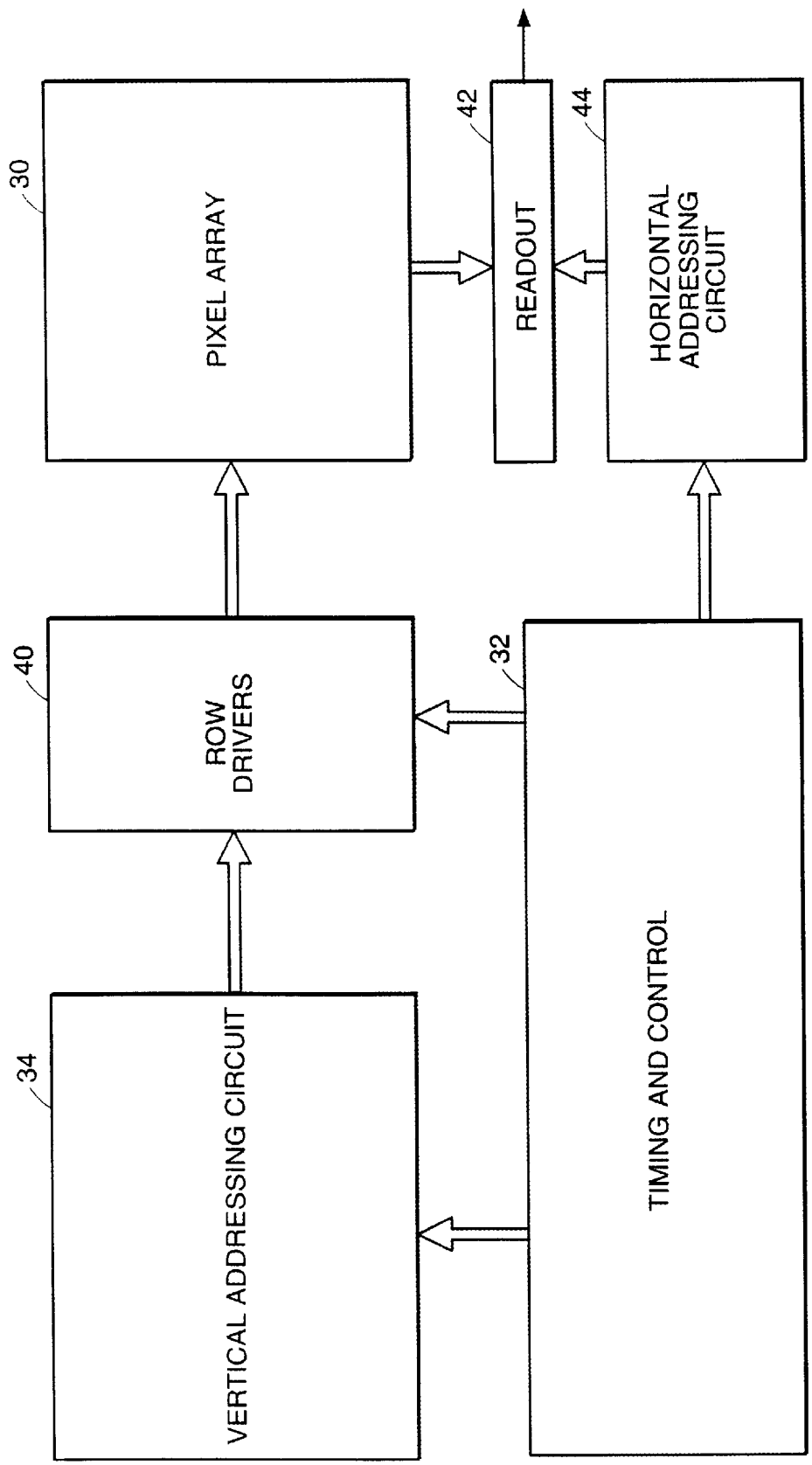
FIG. 1 is a block diagram of an exemplary CMOS active pixel sensor chip.

FIG. 1 shows an exemplary imager 10 implemented as a CMOS active pixel sensor integrated circuit chip. The imager 10 includes an array 30 of active pixel sensors and a controller 32 that provides timing and control signals to enable reading out of signals stored in the pixels. The array 30 can be read out a row at a time using a parallel column readout architecture. The controller 32 selects a particular row of pixels in the array 30 by controlling the operation of a vertical addressing circuit 34 and row drivers 40. Signals stored in the selected row of pixels are read out to circuitry 42 for amplifying the pixel signals and for converting the analog signals to corresponding digital signals. Signals for selecting the digital signals corresponding to a particular column in the array are provided from the controller 32 through a horizontal addressing circuit 44.

Figure 2B:
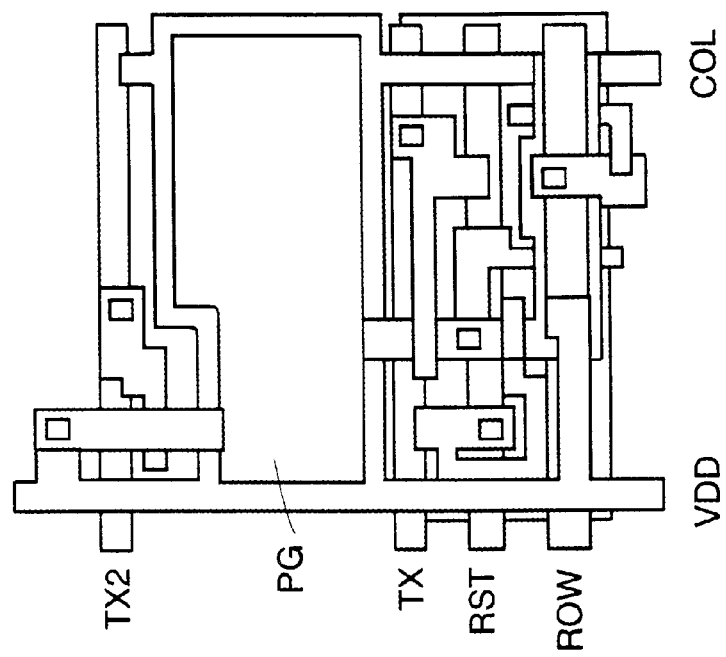
FIG. 2B illustrates an exemplary layout of the pixel in FIG. 2A.
Figure 2A:
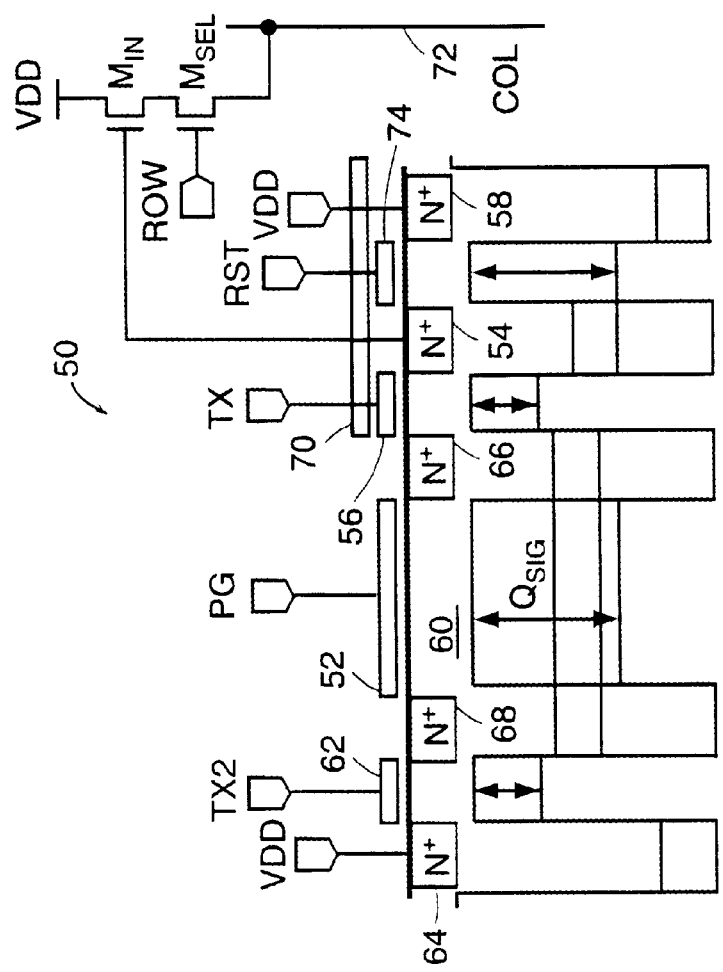
FIG. 2A illustrates a schematic cross-section and potential well diagram of a photogate-type active pixel sensor according to the invention.

As shown in FIGS. 2A and 2B, an exemplary pixel 50 in the array 30 includes a photo-sensitive element, which in the illustrated embodiment, has a photogate 52 with a floating doped output region 54 separated by a first transfer gate electrode 56. The photogate 52 is controlled by a signal (PG). When PG is a digital high signal, charge ($Q_{SIG}$) that is generated as a result of light impinging on the photosensitive element can be accumulated in a photoactive region 60 below the photogate 52. The pixel 50 also includes a second transfer gate electrode 62 also located adjacent the photogate. The respective states of the first and second transfer gates 56, 62 determine whether charge generated beneath the photogate 52 accumulates in the region 60 or is transferred either to the floating doped output region 54 or to a doped region 64 electrically coupled to a power supply voltage ($V_{DD}$).

A signal (TX2) that is applied to the second transfer gate 62 controls the transfer of charge from the photoactive region 60 to the power supply node 64.

A signal (TX) that is applied to the first transfer gate 56 controls the transfer of charge from the photoactive region 60 to the floating doped output region 54 that serves as a charge sense node. The signal from the floating doped output region 54 is buffered by a source-follower transistor $M_{in}$ and a pixel selection switch that can be implemented, for example, as a transistor $M_{sel}$. A signal (ROW) is applied to the gate of the pixel selection switch $M_{sel}$ to enable the pixel to be read out to the readout circuit 42 (FIG. 1). The output signal from a pixel in a particular row is read out via a conductor 72 that is common to all pixels in a particular column. The signal appearing on the conductor 72 is indicated by COL.

The pixel 50 also includes a reset gate 74 controlled by a signal (RST). When the sense node 54 of the pixel 50 is reset, charge in the sense node is drained to a doped region 58 that is electrically coupled to the power supply voltage $V_{DD}$.

The pixel 50 includes a metal shield 70 that covers the sense node 54. The shield 70 also may cover other active circuitry in the pixel other than the photoactive region(s). The shield 70 helps prevent stray light from being sensed and collected by the sense node 54.

The imager 10 can be fabricated, for example, using a single polysilicon standard CMOS process. In that case, doped diffusion regions 66, 68 generally will be present between the photogate 52 and the transfer gates 56, 62. However, if a double polysilicon process is used, the doped diffusion regions 66, 68 preferably are omitted.

Operation of the imager 10 having an array of pixels like the photogate-type pixel 50 is explained with reference to FIGS. 3A, 3B, 3C and 3D. In general, the signals TX, TX2 and PG are common to all the pixels in the array 30. Thus, the integration period for all the pixels in the array occurs at substantially the same time to allow snap-shot operation of the imager 10. The reset and pixel selection signals (RST, ROW) are common to the pixels in a particular row of the array 30. In other words, each row of pixels is provided with its own reset and row selection signals. For the purposes of illustration, it is assumed that there are N rows of pixels in the array 30 and that the rows are read out sequentially in the following order: Row(1), . . . Row(i), Row(i+1), . . . Row(j), . . . Row(N). As explained below, the controller 32 controls the signals PG, TX, TX2, RST and ROW to allow the following operations to be performed: setting pixel integration periods, transferring the integrated signals to the sense nodes 54, and double sampling of pixel outputs. The addition of the second transfer gate 62 together with the various control signals allows the imager 10 to be operated in an electronically-shuttered snap-shot mode. Distortions that might otherwise result from motion artifacts can be reduced or eliminated. Also, removal of overflow charge is facilitated to provide blooming control.

In general, the controller 32 provides timing and control signals so that the integration period for a new image frame can occur while a previous image frame is being read out from the sensing nodes 54. Once all pixels 50 from the previous frame have been read out, the sense nodes 54 in the pixels are reset, and the integrated signals for the new frame can be transferred to the sense nodes. The new frame can subsequently be read out as well.

As can be seen in FIG. 3D, the pixel selection switches $M_{sel}$ are selectively pulsed with respective signals (ROW) so that a previously-stored frame of an image is read out one row at a time. For example, at a time t=t1, row(i) of the array 30 is pulsed to allow signals stored in the sense node 54 of each pixel 50 in that row to be read out to an associated column line 72. After sampling the signals stored by the sense nodes 54 in a particular row of pixels, the sense node in each pixel in that row are reset using the RST signal. The reset value of the pixel is then sampled. Thus, each pixel 50 can be double sampled to allow the readout circuit 42 to provide differential outputs.

Figure 3B:
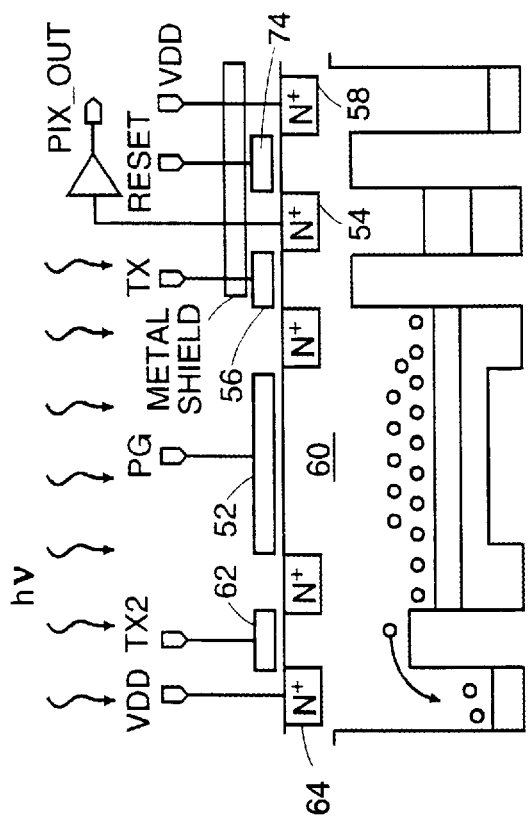
FIGS. 3A, 3B and 3C illustrate schematic cross-sections and potential well diagrams during operation of the photogate-type pixel according to the invention.
Figure 3A:
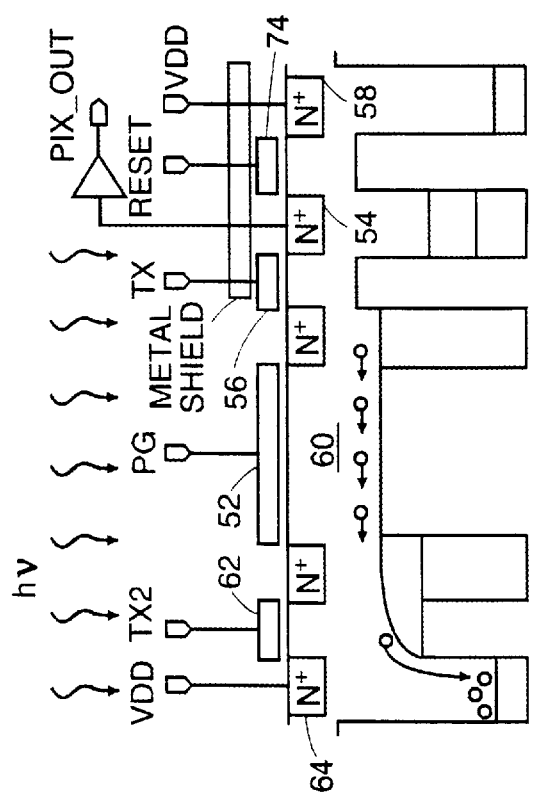

As further shown in FIG. 3D, initially the signal PG controlling the photogate 52 is a digital low signal. To help ensure that the pixels 50 in the array 30 do not integrate charge that may be generated in the photoactive regions 60 beneath the respective photogates during that period, the signal TX2 applied to the respective transfer gates 62 is biased at a digital high voltage level as shown in FIG. 3A. That allows charge that may be generated in the photoactive region 60 to be drained off to the power supply node 64 as a result of the relative potential wells formed beneath the photogate 52 and the transfer gate 62. To prevent any charge from flowing into the sense nodes 54, the signal TX applied to the respective transfer gates 56 is biased at a digital low voltage level. In the illustrated example, signals from a previously-stored frame are read out from the pixels in rows (i) and (i+1) during the non-integration period.

At some later time (somewhat before t=t2 in FIG. 3D), the controller 32 causes the signal PG applied to the photogates 52 of all the pixels 50 to go high. As illustrated in FIG. 3B, that allows each pixel 50 to integrate charge generated in the photoactive region 60. The integration period for all pixels 50 in the array 30 can occur at substantially the same time. During the integration period, charge carriers that are generated in the photoactive region 60 are stored in the photoactive region 60 by the spatially defined potential well in the semiconductor substrate beneath the photogate 52.

The voltage TX2 on the transfer gate 62 can be made sufficiently high to allow the transfer gate to provide blooming control. Thus, the transfer gates 56 and 62 are biased so that TX2>TX. If the light signal impinging on the pixel 50 exceeds the storage capacity of the potential well formed under the photogate 52, excess charges are transferred from the region 60 to the power supply node 64. As shown in FIG. 3D, signals from the previously-stored frame are sampled from pixels in row(j) through row(N) and are read out during the integration period for the next frame.

Toward the end of the integration period for the next frame, the sense node 54 in each of the pixels 50 in the array 30 is reset in preparation for reading out the next frame, as indicated by FIG. 3D. When a sense node 54 is reset, charge that is stored by the sense node is transferred to the power supply node 58. Resetting the sense nodes 54 can help remove residual signal and/or dark current from the pixels.

Figure 3C:
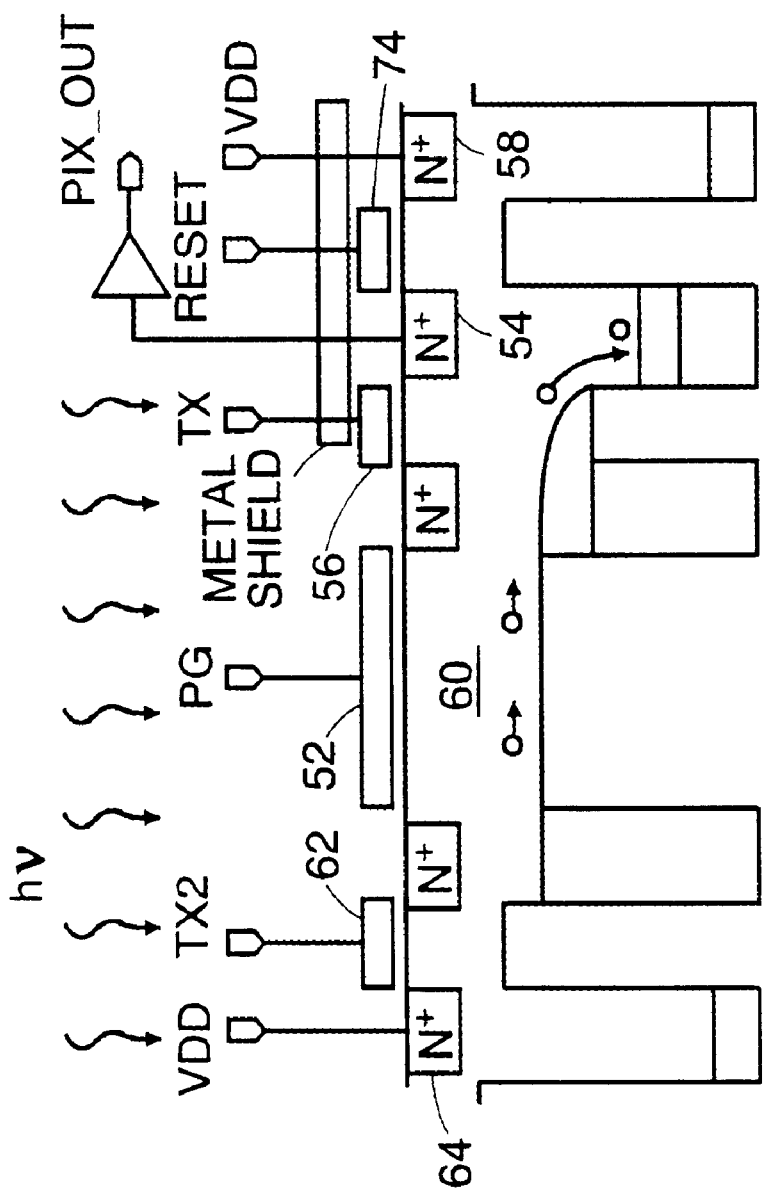

To transfer a signal ($Q_{sig}$) from the region 60 beneath the photogate 52 to the corresponding sense node 54, the controller 32 causes the signal TX2 applied to the second transfer gate 62 to go low and the signal TX applied to the first transfer gate 56 to go high. The controller 32 then causes the signal PG applied to the photogate 52 to go low. As illustrated by FIG. 3C, charge stored in the region 60 of the pixel 50 is transferred to the sense node 54 and simultaneously is prevented from flowing to the voltage supply node 64.

While charge is being transferred from the photogate cells to the sense nodes 54, the pixels 50 should not be read out. However, after completion of the transfer, in other words, once the signal TX on the transfer gate 56 goes low and the signal TX2 on the transfer gate TX2 goes high, the output signals from the pixels 50 can be read out as describe above.

Exemplary values of high bias levels for the signals PG, TX and TX2 are 3.3 volts (V), 1.2 V and 1.2 V, respectively. Similarly, exemplary values of low bias levels for the signals PG, TX and TX2 are 0.5 V, 0.8 V and 0.8 V, respectively.

Imager chips that operate at high shutter speeds to produce high quality images free from motion artifacts can be fabricated. The imager chip can achieve high quantum efficiency (QE), good blooming control, low dark current, low noise and low image lag.

FIG. 4 is a table listing various design specifications and test results for one exemplary embodiment of a photogate-type active pixel sensor using including a second transfer gate as described above. The various specifications and test results are exemplary only and other specifications and results are within the scope of the invention.

For example, instead of using photogate-type pixels as described above, photodiode-type pixels, such as the pixel 80, can be used, as shown in FIGS. 5A and 5B. The pixel 80 includes a photodiode as the photo-sensitive element. In particular, the pixel 80 has a doped region 120 that serves as the photoactive region in which a light signal can be converted into electrical charge. The pixel 80 also includes electrodes 156, 162 that form first and second transfer gates 156, 162 in proximity to the surface of regions of the semiconductor substrate adjacent the photoactive region 120. The first transfer gate 156 separates the photodiode 120 from a floating doped output region 154. The bias voltages on the first and second transfer gates 156, 162 determine whether charge generated in the photoactive region 120 is stored in that region or is transferred either to the floating doped output region 154 or to a doped region 164 electrically coupled to a power supply voltage ($V_{DD}$).

A signal (TX2) that is applied to the second transfer gate 162 controls the transfer of charge from the photodiode 120 to the power supply node 164.

A signal (TX) that is applied to the first transfer gate 156 controls the transfer of charge from the photodiode 120 to the floating doped output region 154 that serves as the charge sense node. As in the photogate implementation previously described, the signal from the floating doped output region 154 is buffered by a source-follower transistor $M_{in}$ and a pixel selection switch that can be implemented, for example, as a transistor $M_{sel}$. A signal (ROW) is applied to the gate of the pixel selection switch $M_{sel}$ to enable a particular row of pixels to be read out to the readout circuit 42 (FIG. 1). The output signal from a pixel in a particular row is read out via a column line 172.

The pixel 80 also includes a reset gate 174 controlled by a signal (RST). When the sense node 154 is reset, charge in the sense node is drained to a doped region 158 that is electrically coupled to the power supply voltage $V_{DD}$.

The pixel 80 includes a metal shield 170 that covers the sense node 154. The metal shield 170 also may cover other active regions of the pixel other than the photoactive region(s). The shield 170 helps prevent stray light from being sensed by the sense node 154.

Operation of the photodiode-type pixel 80 is described with reference to FIGS. 6A, 6B, 6C and 6D. In general, the signals TX and TX2 are common to all the pixels in the array 30. The signal TX2 on the second transfer gate 162 is used to control the pixel integration period. As in the photogate implementation, the integration period for all the pixels in the array occurs at substantially the same time to allow snap-shot operation of the imager 10. The reset and pixel selection signals (RST, ROW) are common to the pixels in a particular row of the array 30. The controller 32 controls the signals TX, TX2, RST and ROW to allow the following operations to be performed: setting pixel integration periods, transferring the integrated signals to the sense nodes 154, and double sampling of pixel outputs. The addition of the second transfer gate 162 together with the various control signals allows the imager 10 to be operated in an electronically-shuttered snap-shot mode.

As previously described with respect to the photogate implementation, the controller 32 provides timing and control signals to the photodiode-type pixels 80 so that the integration period for a new image frame can occur while a previous image frame is being read out from the sensing nodes 154. Once the pixel signals for the previous frame have been read out, the sense nodes are reset, and the integrated signals for the new frame can be transferred to the sense nodes. The new frame can subsequently be read out as well.

As can be seen in FIG. 6D, the pixel selection switches $M_{sel}$ are selectively pulsed with respective signals (ROW) so that a previously-stored frame of an image is read out one row at a time. For example, at a time t=t1, row(i) of the array 30 is pulsed to allow signals stored in the sense node 154 of each pixel 80 in that row to be read out to an associated column line 172. After sampling the signals stored by the sense nodes 154 in a particular row of pixels, the sense node 154 of each pixel in that row is reset using the RST signal. The reset value of the pixel is then sampled. Thus, each pixel 80 can be double sampled to allow the readout circuit 42 to provide differential outputs.

As further shown in FIG. 6D, during the non-integration period (e.g., at t=t1), the voltage signal on the first transfer gate 156 is biased low, and the voltage signal on the second transfer gate 162 is biased high. As illustrated in FIG. 6A, the relative bias levels on the transfer gates 156, 162 are selected so that any charge generated in the photoactive region 120 is drained off to the power supply node 164. In the illustrated example, signals from a previously-stored frame are read out from the pixels in rows (i) and (i+1) during the non-integration period.

At some later time (somewhat before t=t2 in FIG. 5D), the controller 32 causes the signal TX2 applied to the second transfer gate 162 to go low. The bias on the first transfer gate 156 remains low. As illustrated in FIG. 5B, that allows each pixel 80 to integrate charge generated in its photoactive region 120. Thus, charge carriers that are generated in the photoactive region 120 are stored there as a result of the spatially defined potential wells in the semiconductor substrate. As previously noted, the integration period for all pixels 80 in the array 30 occurs at substantially the same time. The voltage TX2 on the transfer gate 162 can be made sufficiently high to allow the transfer gate 162 to provide an anti-blooming function. As shown in FIG. 6B, preferably the transfer gates 156 and 162 are biased with TX2 slightly higher than TX. If the light signal impinging on the pixel 80 exceeds the storage capacity of the photodiode, overflow charges are transferred from the photoactive region 120 to the power supply node 164. As shown in FIG. 6D, signals from the previously-stored frame are sampled from pixels in row(j) through row(N) and are read out during the integration period for the next frame.

Figure 6C:
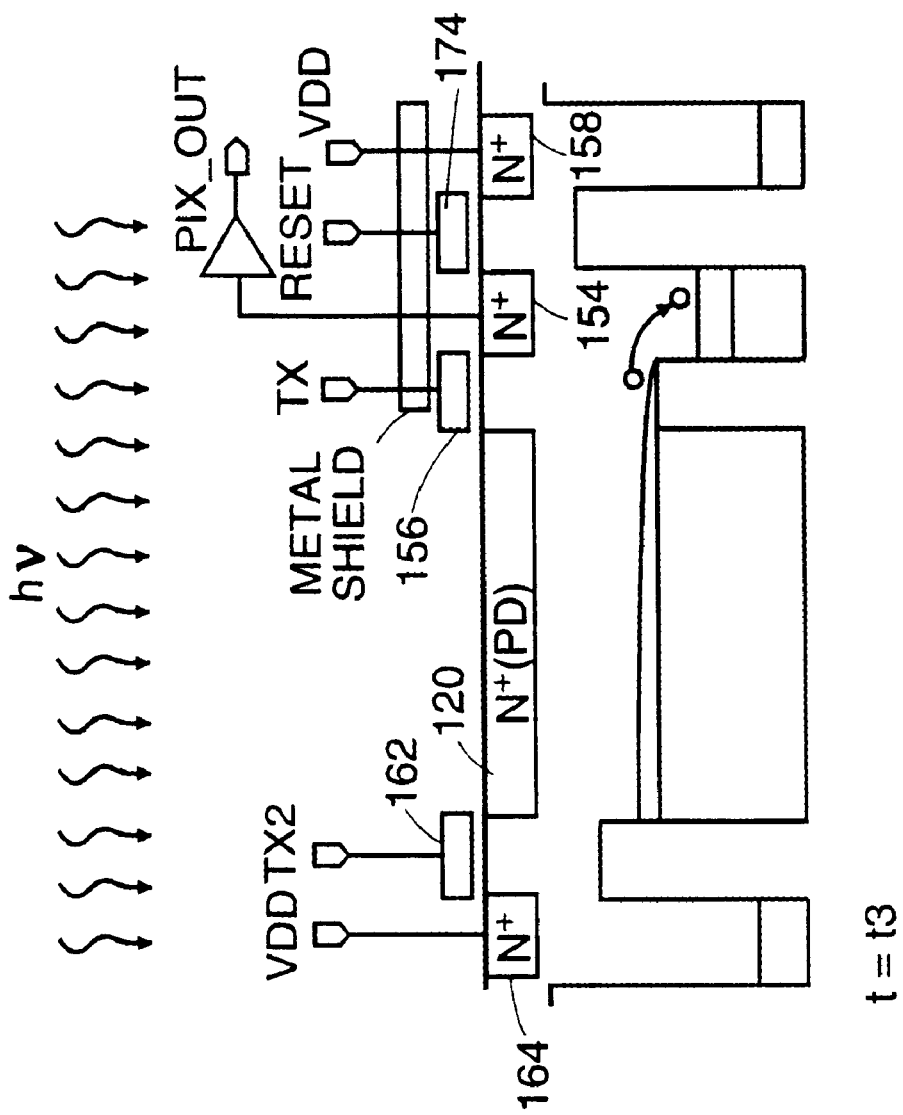

Toward the end of the integration period for the next frame, the sense node 154 of each pixel 80 in the array 30 is reset in preparation for reading out the next frame, as indicated by FIG. 6D. When a sense node 154 is reset, charge that is stored by the sense node is transferred to the power supply node 158. Resetting the sense nodes can help remove residual signals and/or dark current from the pixels. To transfer signals from the photoactive region 120 to the corresponding sense node 154, the controller 32 causes the signal TX applied to the first transfer gate 156 to go high. The bias applied to the second transfer gate 162 remains low. As illustrated by FIG. 6C, charge stored in the photoactive region 120 of each pixel 80 is transferred to the associated sense node 154 and simultaneously is prevented from flowing to the power supply node 164.

While charge is being transferred from the photoactive regions 120 to the sense nodes 154, the pixels 80 should not be read out. However, after completion of the transfer, in other words, once the signal TX on the first transfer gate 156 goes low, the output signals from the pixels 80 can be read out as describe above.

Exemplary values of high bias levels for TX and TX2 are 1.5 V and 1.5 V, respectively. Similarly, exemplary values of low bias levels for TX and TX2 are 0 V and 0.5 V, respectively.

Using the foregoing techniques, high quality imaging can be obtained from an electronically shuttered CMOS imager. The imager can operate at high shutter speeds with simultaneous integration of pixels in the array. Furthermore, the imager can be implemented, for example, using single-polysilicon standard CMOS fabrication processes.

Other implementations are within the scope of the following claims.

What is claimed is:

1. A method of operating a photosensitive pixel, the method comprising:

biasing first and second transfer gates disposed in a vicinity of a photoactive region of a semiconductor substrate to accumulate photocharges in the photoactive region during a pixel integration period;

raising a bias voltage on the first transfer gate and lowering a bias voltage on the second transfer gate to transfer the accumulated photocharges to a sense node via a region of the semiconductor substrate disposed below the first transfer gate; and subsequently biasing the first and second transfer gates to transfer additional photocharges in the photoactive region to a power supply node via a region of the semiconductor substrate disposed below the second transfer gate without passing the additional photocharges through the sense node.

2. The method of claim 1 wherein the second gate is biased to allow excess photocharges in the photoactive region to be transferred to the power supply node via the region of the semiconductor substrate below the second transfer gate during the integration period.

3. The method of claim 2 wherein during the pixel integration period the second transfer gate is biased with a voltage higher than a bias voltage on the first transfer gate.

4. The method of claim 1 including biasing a voltage on a photogate above the photoactive region to accumulate photocharges in the photoactive region during the pixel integration period.

5. The method of claim 4 including lowering a bias voltage on the photogate to transfer the accumulated photocharges to the sense node.

6. The method of claim 1 wherein biasing the first and second transfer gates to transfer additional photocharges in the photoactive region via the second transfer gate includes biasing the second transfer gate with a voltage higher than that of the first transfer gate.

7. The method of claim 6 wherein biasing the second transfer gate with a voltage higher than that of the first transfer gate includes raising the bias voltage applied to the second transfer gate and lowering the bias voltage applied to the first transfer gate.

8. A method of operating an image sensor having an array of photosensitive pixels, the method comprising:

accumulating photocharges in a respective photoactive region of a semiconductor substrate in each pixel of the array during a common pixel integration period;

raising a bias voltage on a respective first transfer gate and lowering a bias voltage on a respective second transfer gate disposed in a vicinity of each photoactive region to transfer the accumulated photocharges from each photoactive region to a respective sense node; and subsequently biasing the respective first and second transfer gates to transfer additional photocharges in the photoactive regions to respective power supply nodes via respective regions of the semiconductor substrate below the second transfer gates, without passing the additional photocharges through the respective sense nodes.

9. The method of claim 8 including reading out signals stored by the respective sense nodes row by row, one row at a time.

10. The method of claim 9 wherein the reading out includes double sampling signals stored by the respective sense nodes.

11. The method of claim 8 wherein biasing the respective first and second transfer gates to transfer additional photocharges in the photoactive regions to respective power supply nodes is performed prior to commencing a subsequent pixel integration period.

* * * * *